(12) United States Patent
Huang (10) Patent No.: US 10,488,944 B1
(45) Date of Patent: Nov. 26, 2019

(54) KEYBOARD DEVICE

(71) Applicant: Primax Electronics Ltd., Taipei (TW)

(72) Inventor: Shu-An Huang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 16/192,215

(22) Filed: Nov. 15, 2018

(30) Foreign Application Priority Data

Aug. 17, 2018 (TW) .................. 107128839

(51) Int. Cl.
| | | |
|---|---|---|
| *G06F 3/02* | (2006.01) | |
| *H03K 17/967* | (2006.01) | |
| *H01H 13/7073* | (2006.01) | |
| *G06F 1/16* | (2006.01) | |

(52) U.S. Cl.
CPC ............ *G06F 3/0202* (2013.01); *G06F 3/021* (2013.01); *H01H 13/7073* (2013.01); *H03K 17/967* (2013.01); *G06F 1/1666* (2013.01); *G06F 3/0221* (2013.01); *H01H 2221/044* (2013.01)

(58) Field of Classification Search
CPC ...... G06F 3/0202; G06F 3/021; G06F 3/0221; G06F 1/1666; H01H 13/7073
See application file for complete search history.

(56) References Cited

U.S. PATENT DOCUMENTS

| | | | | | |
|---|---|---|---|---|---|
| 5,490,039 | A | * | 2/1996 | Helms ................... | G06F 1/1616 361/679.55 |
| 5,655,743 | A | * | 8/1997 | Gillis .................... | G06F 3/0202 248/346.01 |
| 5,901,934 | A | * | 5/1999 | Wilson .................. | G06F 3/0395 248/346.01 |
| 5,995,082 | A | * | 11/1999 | Lakoski ................ | G06F 1/1632 248/918 |
| 6,003,446 | A | * | 12/1999 | Leibowitz ............ | A47B 23/002 108/43 |
| 6,384,812 | B1 | * | 5/2002 | Dunn .................... | G06F 3/0202 345/156 |
| 6,757,159 | B2 | * | 6/2004 | Zarek .................... | G06F 1/1616 108/43 |
| 7,752,981 | B2 | * | 7/2010 | Blackburn ............. | G06F 3/039 108/102 |
| 2012/0155003 | A1 | * | 6/2012 | Dondurur ............. | G06F 1/1656 361/679.08 |

* cited by examiner

*Primary Examiner* — Nidhi Thaker
(74) *Attorney, Agent, or Firm* — Kirton McConkie; Evan R. Witt (57) ABSTRACT

A keyboard device includes a keyboard base, a top cover, plural keys, a storing frame and a sliding member. The keyboard base includes a base slot. The keyboard base is covered by the top cover. The storing frame is fixed on a bottom surface of the top cover. A first end of the storing frame is arranged near the base slot. The sliding member is selectively stored within the storing frame or moved relative to the keyboard base to be partially protruded out of the base slot. When the keyboard device is in a storage state, the sliding member is stored within the storing frame. When the keyboard device is in a mouse operation state, the sliding member is partially protruded out of the storing frame and the base slot so as to support a mouse device.

8 Claims, 8 Drawing Sheets

KEYBOARD DEVICE

FIELD OF THE INVENTION

The present invention relates to an input device, and more particularly to a keyboard device with plural key structures.

BACKGROUND OF THE INVENTION

Generally, the widely-used peripheral input device of a computer system includes for example a mouse device, a keyboard device, a trackball device, or the like. Via the keyboard device, characters or symbols can be directly inputted into the computer system. The mouse device can be intuitively operated by the user. Consequently, most users and most manufacturers of input devices pay much attention to the development of keyboard devices and mouse devices.

Figure 1:
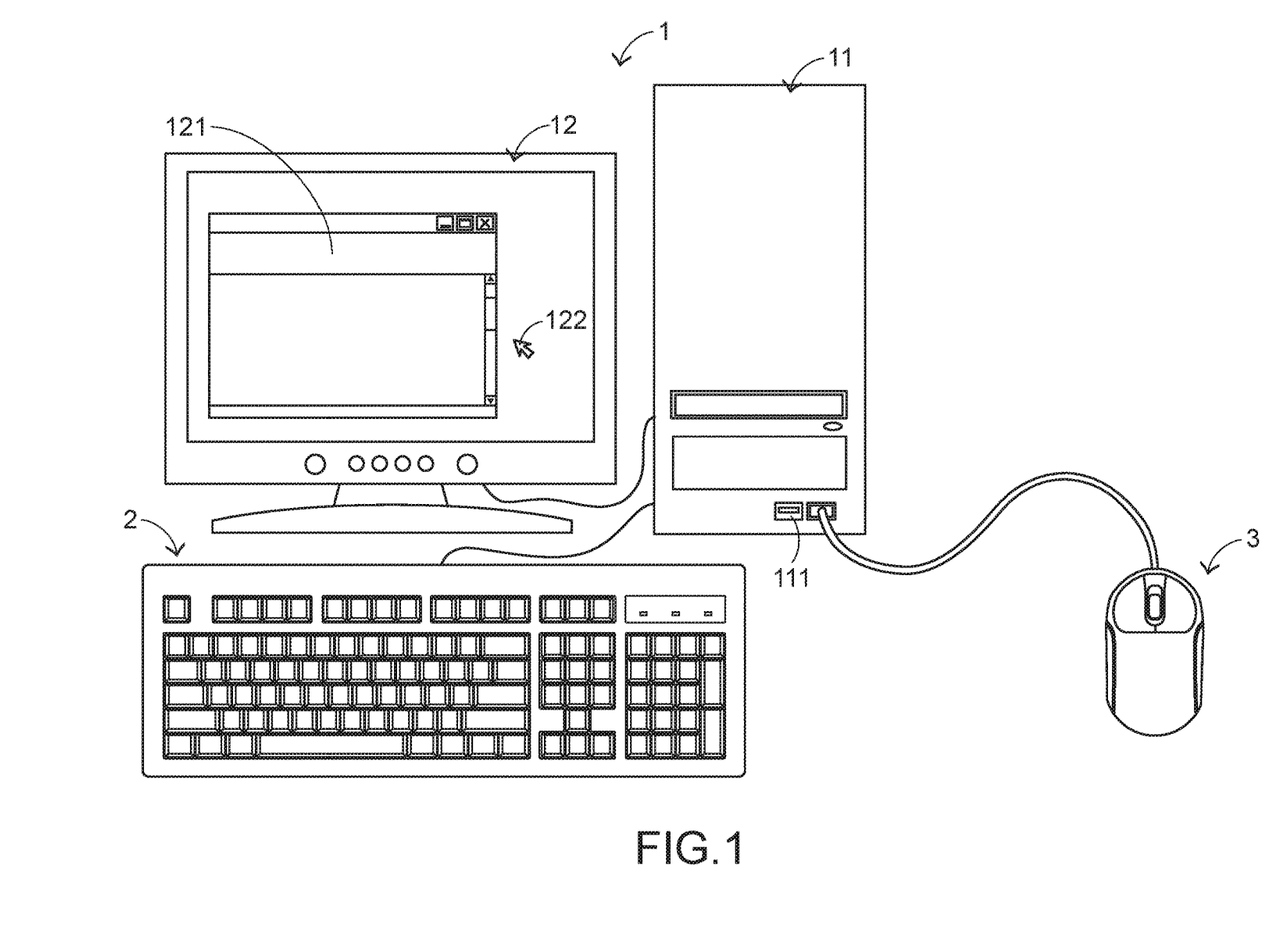
FIG. 1 is a schematic cross-sectional side view illustrating a conventional key structure.

FIG. 1 schematically illustrates the relationship between a computer, a conventional keyboard device and a conventional mouse device. In FIG. 1, a computer system 1, a keyboard device 2 and a mouse device 3 are shown. The computer system 1 comprises a computer host 11 and a computer monitor 12. The computer host 11 is connected with the mouse device 3 and the computer monitor 12. The computer host 11 comprises plural connecting ports 111. The plural connecting ports 111 are connected with the keyboard device 2 and the mouse device 3. A graphic-based window 121 and a cursor 122 are displayed on the computer monitor 12. By operating the mouse device 3, the movement of cursor 122 is correspondingly controlled. Consequently, the computer system 11 executes a corresponding command. The mouse device 3 comprises a casing, a left button, a right button and a scroll wheel. The structure and operation of the mouse device 3 are well known to those skilled in the art, and are not redundantly described herein.

When the keyboard device 2 is operated by the user, a corresponding key signal is transmitted to the computer host 11. Consequently, the computer host 11 executes a command corresponding to the key signal. The conventional keyboard device 2 comprises a keyboard base, a top cover and plural keys. The structure and operation of the conventional keyboard device 2 are well known to those skilled in the art, and are not redundantly described herein. When the keyboard device 2 and the mouse device 3 are placed on a working surface, the user may operate the keyboard device 2 and the mouse device 3 to control the computer system 1.

With increasing development of science and technology, the functionality and the slimness benefit of the input device are gradually enhanced. For example, a wireless keyboard device and a wireless mouse device are wirelessly connected with the computer host according to a wireless communication technology. Since the uses of the wireless keyboard device and the wireless mouse device are not restricted by the physical cables, the user can operate the wireless keyboard device and the wireless mouse device more easily. For example, when the user sits on a sofa, the wireless keyboard device is placed on thighs of the user and the wireless mouse device is placed on the sofa, the user may operate the wireless keyboard device and the wireless mouse device to control the computer host. However, when the wireless mouse device is placed on the sofa, the user has to stretch the arm as much as possible to touch the wireless mouse device. This gesture does not meet the ergonomics requirements. Consequently, it is difficult for the user to operate the wireless mouse device.

Therefore, there is a need of providing a keyboard device with the function of assisting the user in operating a mouse device.

SUMMARY OF THE INVENTION

An object of the present invention provides a keyboard device with the function of assisting the user in operating a mouse device.

In accordance with an aspect of the present invention, there is provided a keyboard device. The keyboard device includes a keyboard base, a top cover, plural keys, a storing frame and a sliding member. The keyboard base includes a base slot. The keyboard base is covered by the top cover. The plural keys are penetrated through the top cover and partially exposed outside the top cover. The storing frame is fixed on a bottom surface of the top cover. A first end of the storing frame is arranged near the base slot. The sliding member is selectively stored within the storing frame or moved relative to the keyboard base to be partially protruded out of the base slot. When the keyboard device is in a storage state, the sliding member is stored within the storing frame. When the keyboard device is in a mouse operation state, the sliding member is partially protruded out of the storing frame and the base slot so as to support a mouse device.

In an embodiment, the storing frame includes a main body, a track structure, a first notch and a second notch. The main body is fixed on the bottom surface of the top cover. The track structure is arranged around a portion of the main body. The sliding member is accommodated within the track structure. The sliding member is movable relative to the keyboard base along the track structure. The first notch is formed in the track structure and located at a first side of the track structure. When the sliding member is inserted into the first notch, the sliding member is fixed on the storing frame. The second notch is formed in the track structure and located at a second side of the track structure. When the sliding member is inserted into the second notch, the sliding member is fixed on the storing frame.

In an embodiment, the sliding member includes a supporting plate, a linking plate, a locking element, a poke rod and an elastic element. The mouse device is supported on a top surface of the supporting plate. The linking plate is disposed on a bottom surface of the supporting plate and movable relative to the supporting plate. The locking element is connected with the linking plate and permitted to be swung relative to the linking plate. When the locking element is inserted into the first notch or the second notch, the sliding member is fixed on the storing frame. The poke rod is located at an end of the linking plate and partially exposed outside the keyboard base. While the poke rod is poked, the linking plate is correspondingly moved. The elastic element is arranged between a sidewall of the supporting plate and the poke rod. While the elastic element is pushed by the poke rod, the elastic element is compressed to generate an elastic force.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For solving the drawbacks of the conventional technologies, the present invention provides a keyboard device with a sliding member. The sliding member is stored within the keyboard device. When the user intends to use a mouse device, the sliding member is pulled out of the keyboard device to support the mouse device.

Figure 2:
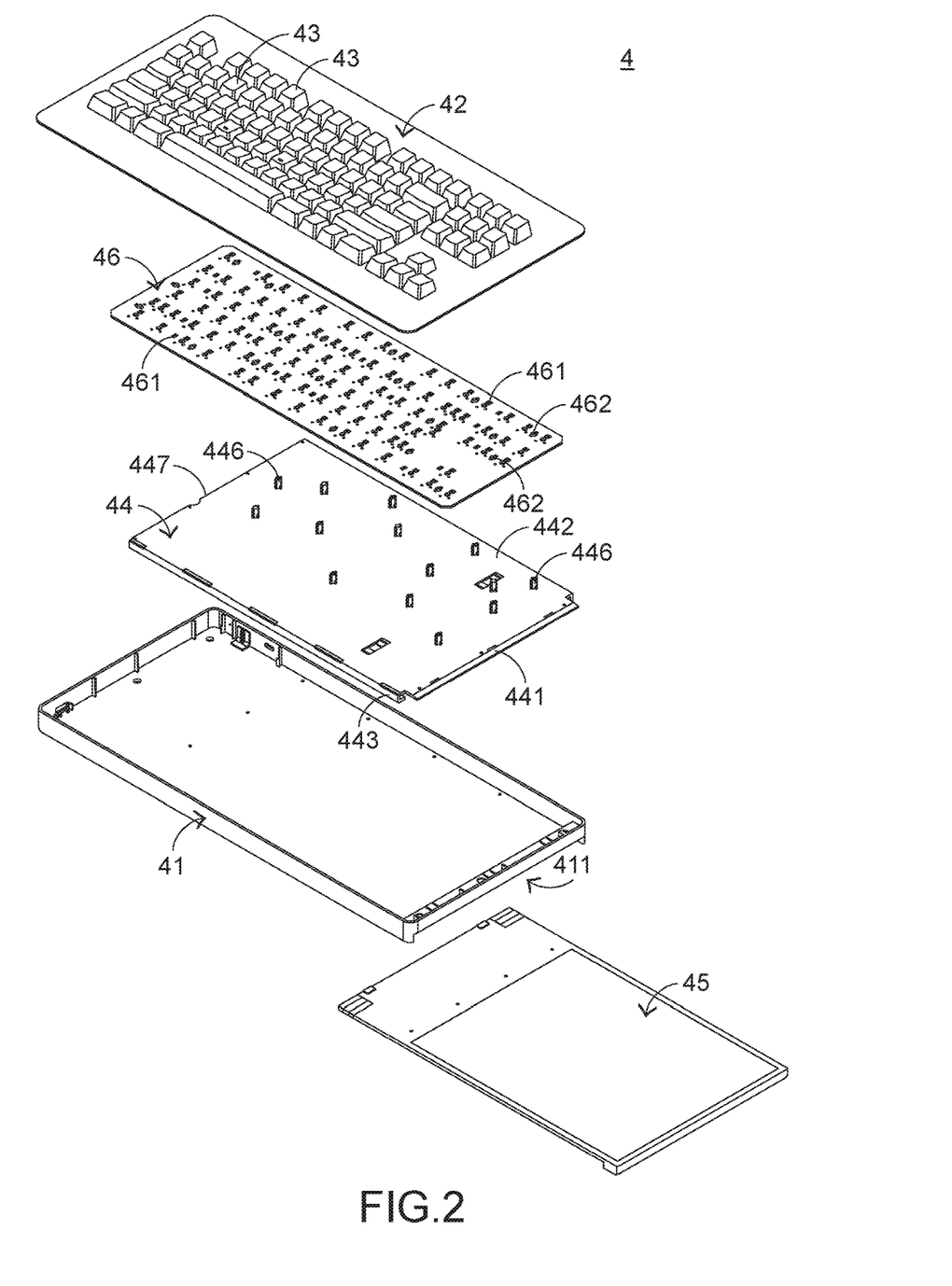
FIG. 2 is a schematic exploded view illustrating a portion of a keyboard device according to an embodiment of the present invention.
Figure 3:
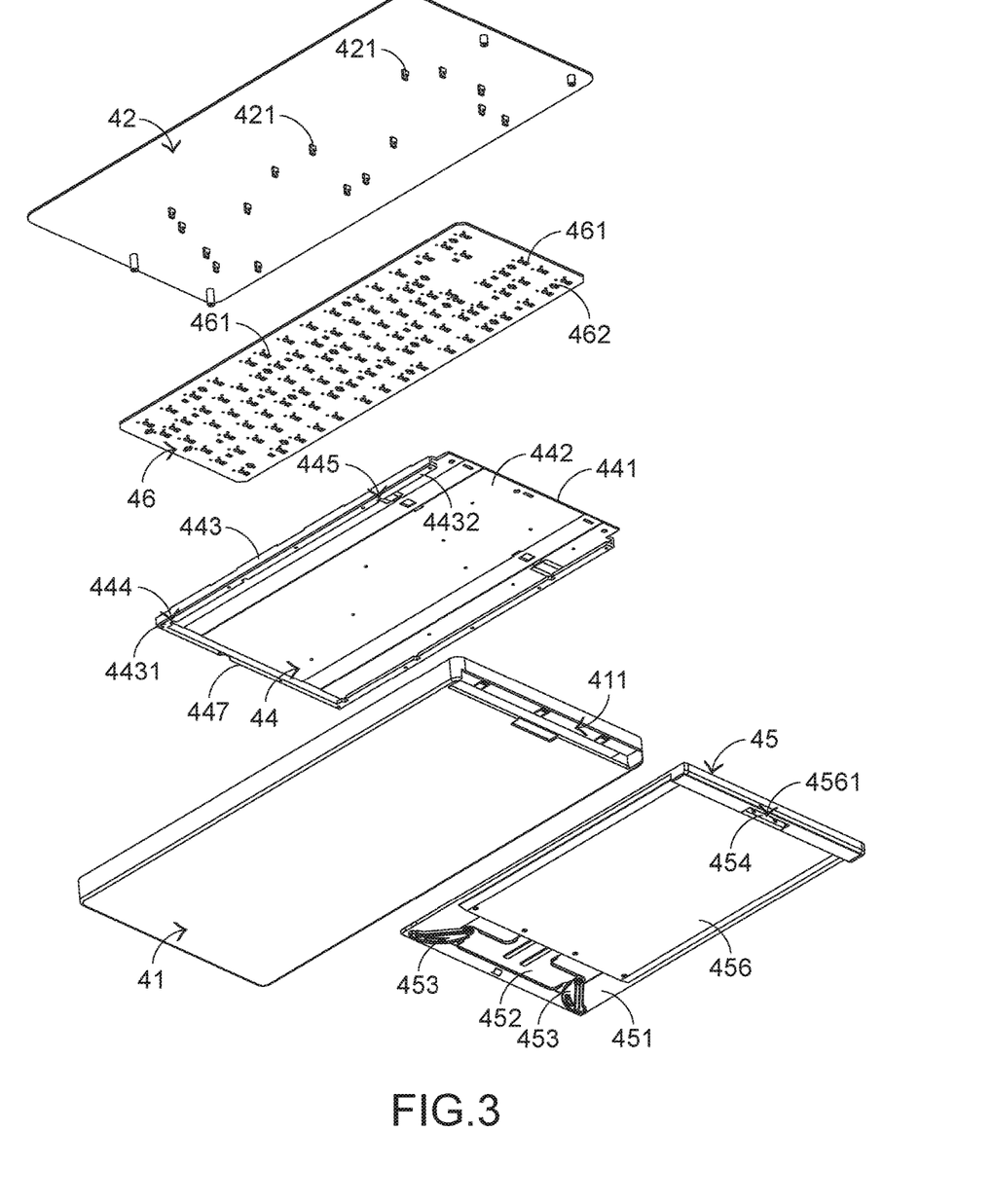
FIG. 3 is a schematic exploded view illustrating a portion of the keyboard device according to the embodiment of the present invention and taken along another viewpoint.
Figure 4:
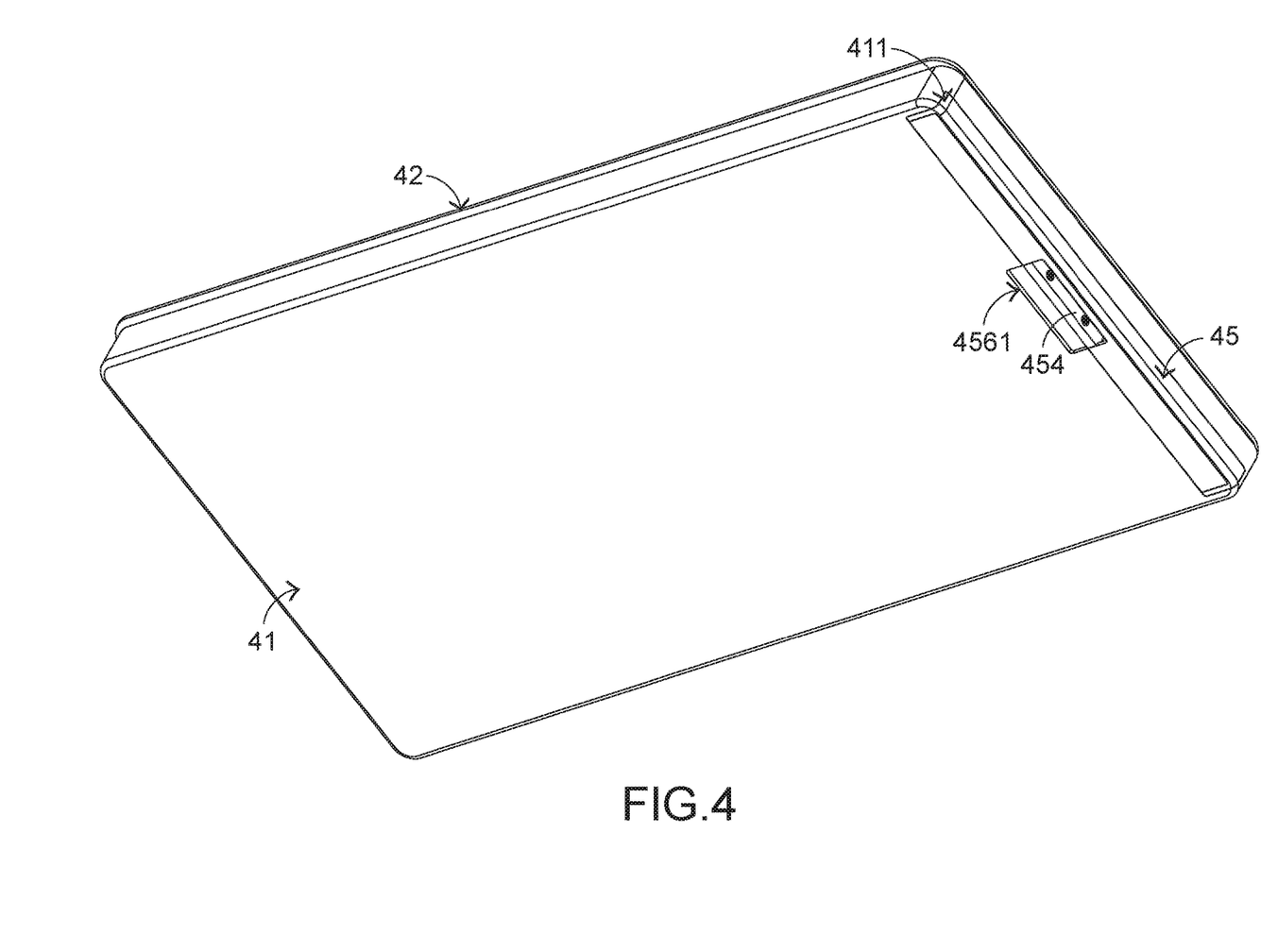
FIG. 4 is a schematic perspective view illustrating the outer appearance of the keyboard device according to the embodiment of the present invention, in which the keyboard device is in a storage state.

Hereinafter, the structure of the keyboard device will be illustrated with reference to FIGS. 2, 3 and 4. FIG. 2 is a schematic exploded view illustrating a portion of a keyboard device according to an embodiment of the present invention. FIG. 3 is a schematic exploded view illustrating a portion of the keyboard device according to the embodiment of the present invention and taken along another viewpoint. FIG. 4 is a schematic perspective view illustrating the outer appearance of the keyboard device according to the embodiment of the present invention, in which the keyboard device is in a storage state.

The keyboard device 4 comprises a keyboard base 41, a top cover 42, plural keys 43, a storing frame 44, a sliding member 45 and a circuit board 46. The keyboard base 41 comprises a base slot 411. The base slot 411 is located at a side of the keyboard base 41. The keyboard base 41 is covered by the top cover 42. The top cover 42 comprises plural hooks 421 and plural openings (not shown). The plural hooks 421 are disposed on a bottom surface of the top cover 42. The plural openings run through the top cover 42. The plural openings are aligned with the plural keys 43, respectively. The plural keys 43 are penetrated through the top cover 42 through the corresponding openings and exposed outside the top cover 42. For succinctness, the plural openings of the top cover 42 are not shown. The circuit board 46 is fixed on the bottom side of the top cover 42. The circuit board 46 comprises plural first circuit board holes 461 and plural second circuit board holes 462. Each first circuit board hole 461 is aligned with one hook 421. After the hooks 421 are penetrated through the corresponding first circuit board holes 461 and engaged with the corresponding first circuit board holes 461, the circuit board 46 is fixed on the bottom side of the top cover 42.

Please refer to FIGS. 2, 3 and 4. The storing frame 44 is fixed on the bottom surface of the top cover 42. A first end 441 of the storing frame 44 is arranged near the base slot 411. The sliding member 45 can be stored within the storing frame 44. Moreover, as the sliding member 45 is moved relative to the keyboard base 41, the sliding member 45 is partially protruded out of the base slot 411. When the keyboard device 4 is in a storage state, the sliding member 45 is stored within the storing frame 44. When the keyboard device 4 is in a mouse operation state, the sliding member 45 is partially protruded out of the storing frame 44 and the base slot 411 so as to support the mouse device 5 (see FIG. 8). The key 43 comprises an elastic element and other inner components. Consequently, the key 43 can be depressed or returned to its original position. The inner components and their operations are well known to those skilled in the art, and are not redundantly described and shown herein.

The detailed structure of the storing frame 44 will be described as follows. Please refer to FIGS. 2 and 3 again. The storing frame 44 comprises a main body 442, a track structure 443, plural first notches 444, plural second notches 445 and plural fixing posts 446. The main body 442 is fixed on the bottom surface of the top cover 42. The track structure 443 is arranged around a portion of the main body 442. The sliding member 45 is accommodated within the track structure 443. Moreover, the sliding member 45 is movable relative to the keyboard base 41 along the track structure 443. The plural first notches 444 are formed in the track structure 443 and located at a first side 4431 of the track structure 443. When the corresponding structure of the sliding member 45 is inserted into the first notches 444, the sliding member 45 is fixed on the storing frame 44. Similarly, the plural second notches 445 are formed in the track structure 443 and located at a second side 4432 of the track structure 443. When the corresponding structure of the sliding member 45 is inserted into the second notches 445, and thus the sliding member 45 is fixed on the storing frame 44. The plural fixing posts 446 are disposed on the main body 442. Each fixing post 446 is aligned with one second circuit board hole 462 of the circuit board 46. The fixing posts 446 are penetrated through the corresponding second circuit board holes 462 and contacted with the top cover 42. After screwing elements are penetrated through corresponding screwing holes (not shown) of the top cover 42 and tightened in the top cover 42, the storing frame 44 is fixed on the bottom side of the top cover 42.

In an embodiment, the track structure 443 is a U-shaped structure that is arranged around the main body 442. Moreover, the track structure 443 is protruded downwardly from the main body 442. That is, the track structure 443 is integrally formed with the main body 442. It is noted that numerous modifications and alterations may be made while retaining the teachings of the invention. For example, the track structure is fixed on a bottom surface of the main body 442 through any other appropriate coupling means.

Figure 5:
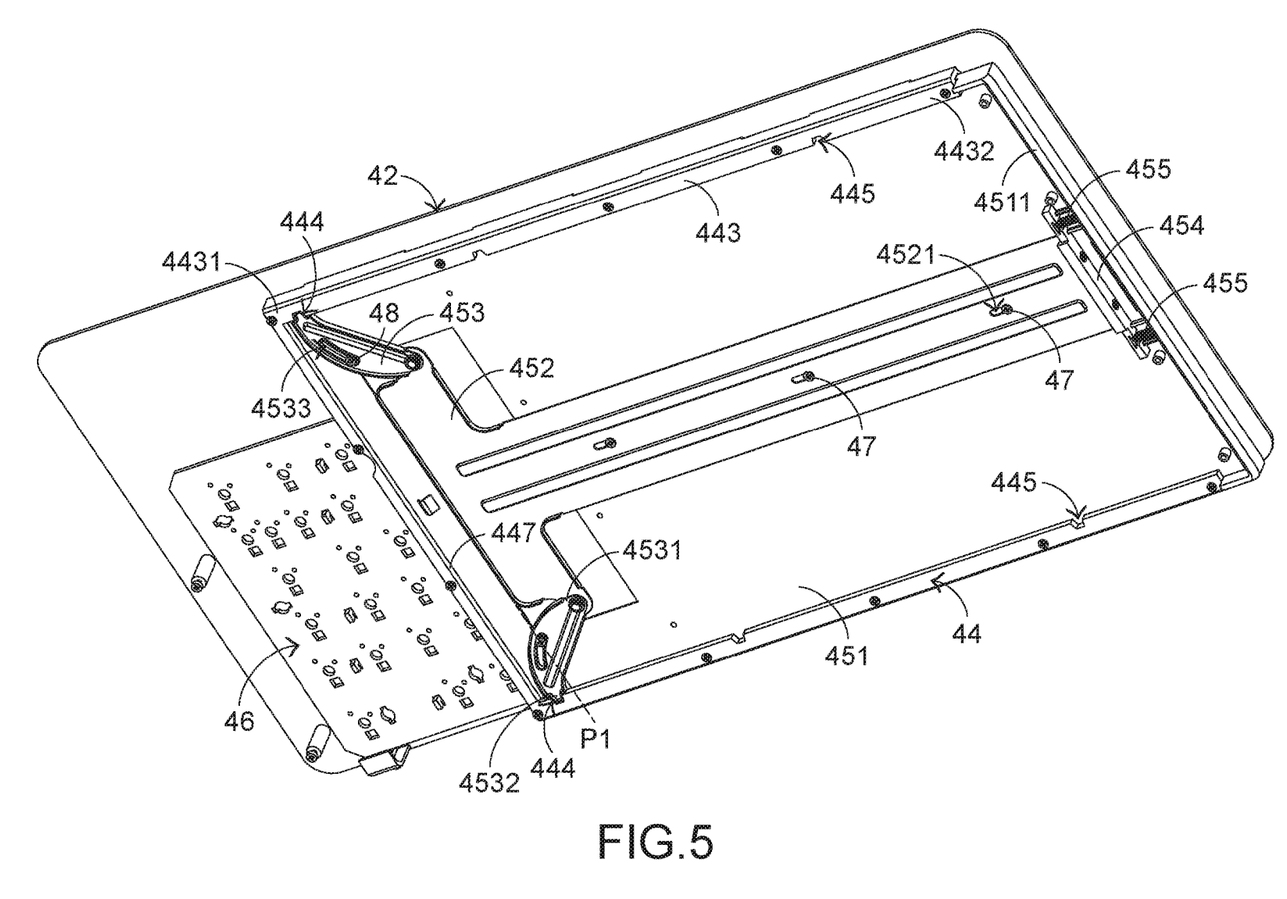
FIG. 5 is a schematic perspective view illustrating a portion of the keyboard device according to the embodiment of the present invention, in which the keyboard device is in the storage state.

Hereinafter, the detailed structure of the sliding member 45 will be described with reference to FIGS. 3 and 5. FIG. 5 is a schematic perspective view illustrating a portion of the keyboard device according to the embodiment of the present invention, in which the keyboard device is in the storage state. The sliding member 45 comprises a supporting plate 451, a linking plate 452, plural locking elements 453, a poke rod 454, plural elastic elements 455 and a covering part 456. The mouse device 5 is supported on a top surface of the supporting plate 451. The linking plate 452 is disposed on a bottom surface of the supporting plate 451 and movable relative to the supporting plate 451. The linking plate 452 comprises plural fixing holes 4521. After plural first fixing elements 47 are penetrated through the corresponding fixing holes 4521, the linking plate 452 is disposed on the bottom surface of the supporting plate 451. Due to the structures of the first fixing elements 47 and the corresponding fixing holes 4521, the linking plate 452 is fixed on the bottom surface of the supporting plate 451 and movable relative to the supporting plate 451. In this embodiment, the linking plate 452 has a T shape, and the first fixing elements 47 are screws. Moreover, the first fixing elements 47 are disposed on the bottom surface of the supporting plate 451 through a screwing means. It is noted that numerous modifications and alterations may be made while retaining the teachings of the invention. The examples of the first fixing elements are not restricted as long as the linking plate is movably fixed on the supporting plate through the first fixing elements.

The first ends 4531 of the plural locking elements 453 are connected with bilateral sides of the linking plate 452. In addition, the locking elements 453 can be swung relative to the linking plate 452. As the locking elements 453 are swung relative to the linking plate 452, the second ends 4532 of the locking elements 453 are inserted into the corresponding first notches 444 or the corresponding second notches 445, so that the sliding member 45 is fixed on the storing frame 44. Each locking element 453 comprises a locking hole 4533. After second fixing elements 48 are penetrated through the corresponding locking holes 4533, the locking elements 453 are fixed on the bottom surface of the linking plate 452. Consequently, while the locking elements 453 are swung relative to the linking plate 452, the locking elements 453 are smoothly swung and not detached from the linking plate 452. In an embodiment, the second fixing elements 48 are screws, and the locking elements 453 are fixed on the linking plate 452 by the second fixing elements 48 through a screwing means. It is noted that numerous modifications and alterations may be made while retaining the teachings of the invention. The examples of the second fixing elements are not restricted as long as the locking elements are movably fixed on the linking plate through the second fixing elements.

Please refer to FIGS. 3 and 5. The poke rod 454 is located at an end of the linking plate 452 and partially exposed outside the keyboard base 41. By poking the poke rod 454, the linking plate 452 is correspondingly moved. The plural elastic elements 455 are arranged between a sidewall 4511 of the supporting plate 451 and the poke rod 454. As the poke rod 454 is moved to push the elastic elements 455, the elastic elements 455 are compressed to generate elastic forces. Consequently, the linking plate 452 is correspondingly moved. As shown in FIG. 3, the linking plate 452 is covered by the covering part 456, and the covering part 456 is disposed on the bottom surface of the supporting plate 451. The covering part 456 comprises an aperture 4561. The poke rod 454 is exposed outside the covering part 456 through the aperture 4561. Consequently, the user's fingers can be contacted with the poke rod 454. In an embodiment, the elastic elements 455 are springs.

Figure 6:
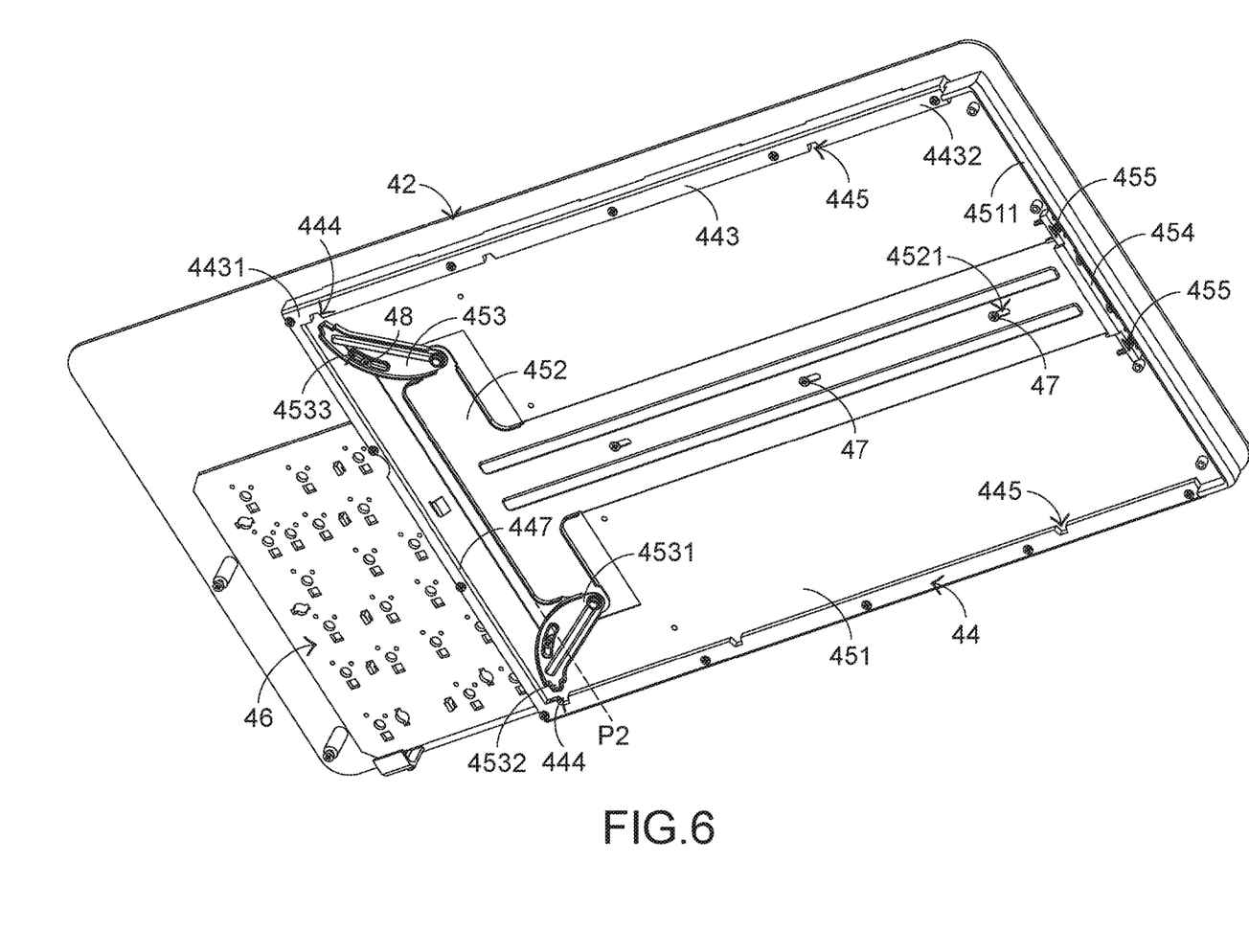
FIG. 6 is a schematic perspective view illustrating a portion of the keyboard device according to the embodiment of the present invention, in which the poke rod is poked.
Figure 7:
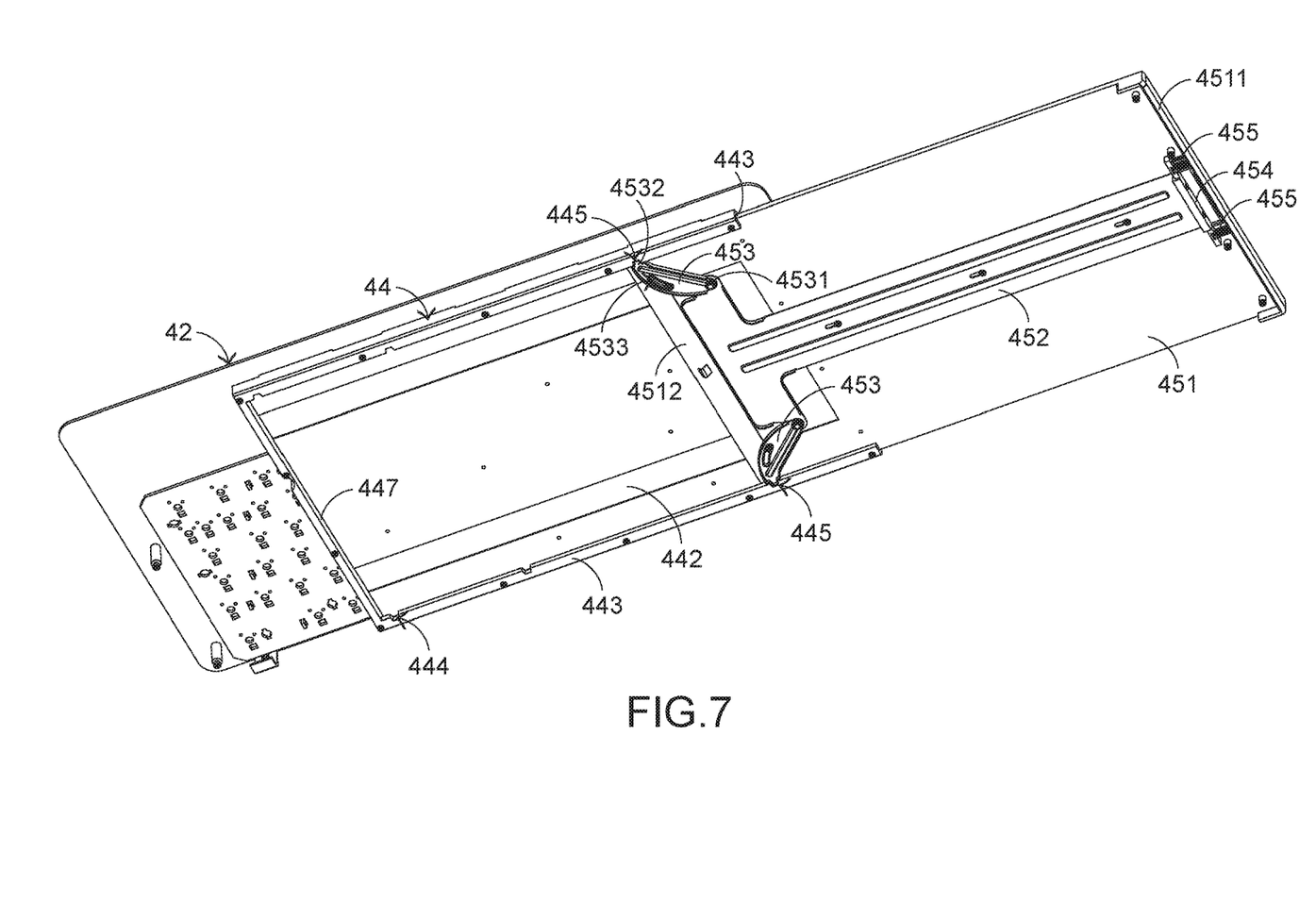
FIG. 7 is a schematic perspective view illustrating a portion of the keyboard device according to the embodiment of the present invention, in which the keyboard device is in a mouse operation state.
Figure 8:
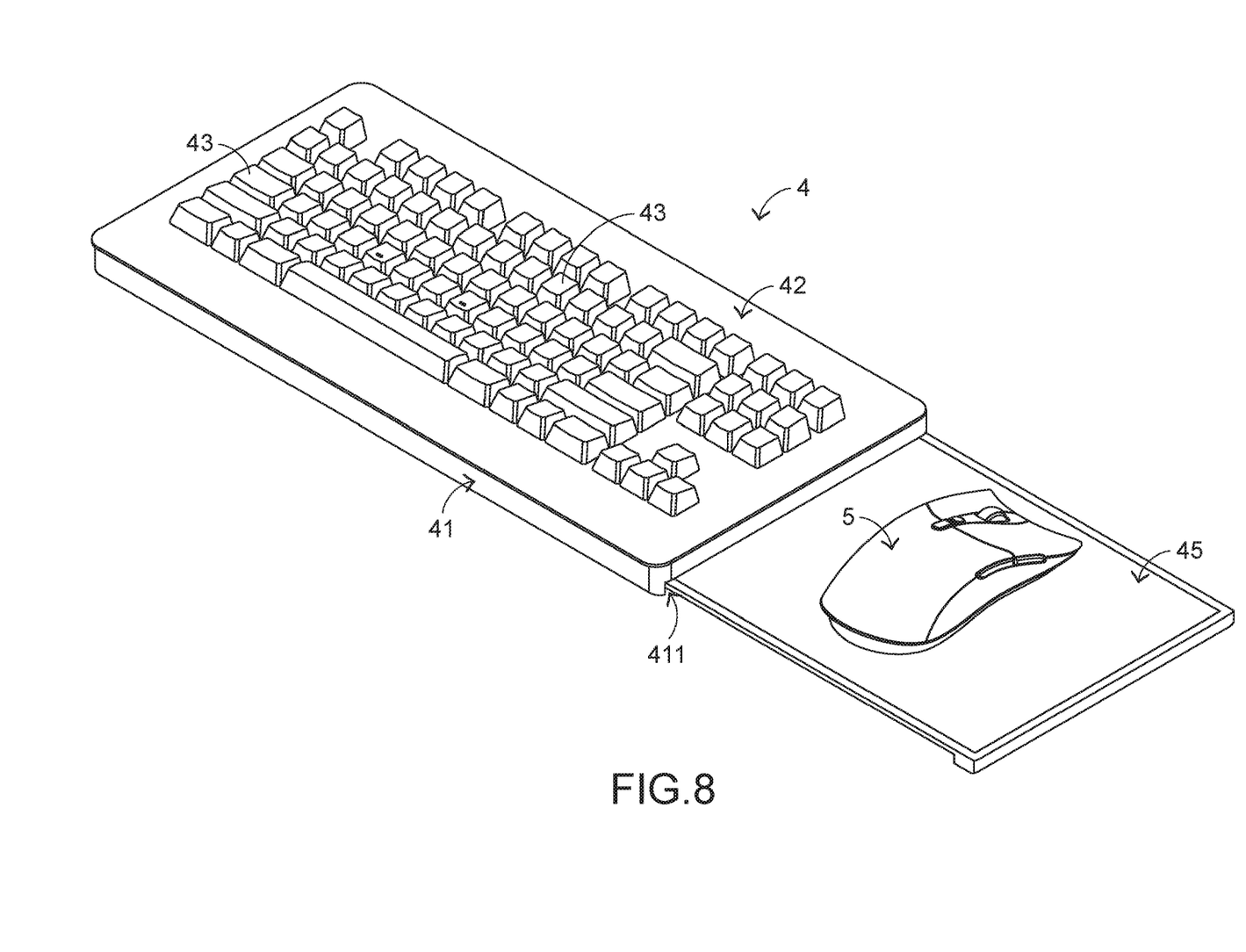
FIG. 8 is a schematic perspective view illustrating the outer appearance of the keyboard device according to the embodiment of the present invention, in which the keyboard device is in a mouse operation state.

The operations of the keyboard device 4 will be described with reference to FIGS. 2 to 8. FIG. 6 is a schematic perspective view illustrating a portion of the keyboard device according to the embodiment of the present invention, in which the poke rod is poked. FIG. 7 is a schematic perspective view illustrating a portion of the keyboard device according to the embodiment of the present invention, in which the keyboard device is in a mouse operation state. FIG. 8 is a schematic perspective view illustrating the outer appearance of the keyboard device according to the embodiment of the present invention, in which the keyboard device is in a mouse operation state.

As shown in FIGS. 4 and 5, the sliding member 45 is stored within the storing frame 44 of the keyboard device 4. Meanwhile, the keyboard device 4 is in a storage state, and the sliding member 45 is exposed outside the base slot 411. A first end 4512 of the supporting plate 451 is contacted with a second end 447 of the storing frame 44. The linking plate 452 is in a first position P1 of the supporting plate 451. The locking elements 453 are inserted into the corresponding first notches 444, and thus the sliding member 45 is fixed on the storing frame 44. The poke rod 454 is located under the base slot 411 (see FIG. 5).

For operating the mouse device 5, the user's fingers are inserted into the aperture 4561 of the covering part 456 and then the user's fingers are contacted with the poke rod 454. By applying a pulling force, the poke rod 454 is poked in the direction toward the sidewall 4511 of the supporting plate 451 (i.e., in the direction toward the outside of the base slot 411). As the poke rod 454 is moved to push the elastic elements 455, the elastic elements 455 are compressed. Moreover, as the poke rod 454 is moved, the linking plate 452 is moved in the direction toward the sidewall 4511 of the supporting plate 451. That is, the linking plate 452 is moved from the first position P1 of the supporting plate 451 to a second position P2 of the supporting plate 451. During the process of moving the linking plate 452, the locking elements 453 are moved with the linking plate 452 and detached from the first notches 444 (see FIG. 6).

After the locking elements 453 are detached from the first notches 444, the supporting plate 451 is movable and not fixed. Then, the poke rod 454 is pulled in the direction toward the outside of the base slot 411. Consequently, the supporting plate 451 is moved. In response to the pulling force of the user, the supporting plate 451 is moved relative to the keyboard base 41 along the track structure 443 and moved to the position near the base slot 411. As the linking plate 452 and the locking elements 453 are moved with the supporting plate 451, the locking elements 453 are moved to the positions near the second notches 445. When the supporting plate 451 is pulled and the first end 4512 of the supporting plate 451 is arranged near the first end 441 of the storing frame 44, the pulling force is no longer applied to the poke rod 454. Meanwhile, the elastic elements 455 are restored from the compressed state to the original state according to the elasticity of the elastic elements 455. In addition, the elastic elements 455 provide an elastic force to the poke rod 454. In response to the elastic force, the linking plate 452 is moved from the second position P2 of the supporting plate 451 to the first position P1 of the supporting plate 451. As the linking plate 452 is moved, the locking elements 453 are inserted into the corresponding second notches 445 and the sliding member 45 is fixed on the storing frame 44. Since the sliding member 45 has been pushed by the user, the poke rod 454 is located at the position away from the base slot 411. Meanwhile, the keyboard device 4 is in the mouse operation state (see FIGS. 7 and 8).

For switching the operation state of the keyboard device from the mouse operation state to the storage state, the poke rod 454 is pulled and the linking plate 452 is moved from the first position P1 of the supporting plate 451 to the second position P2 of the supporting plate 451. Consequently, the locking elements 453 are detached from the positions near the second notches 445. Then, the user only needs to push the sliding member 45. When the first end 4512 of the supporting plate 451 is contacted with the second end 447 of the storing frame 44, the pushing force is stopped. The locking elements 453 are inserted into the corresponding first notches 444, and thus the sliding member 45 is fixed on the storing frame 44.

When the keyboard device 4 is in the mouse operation state, the user may place the mouse device 5 on the supporting plate 451 to operate the mouse device 5. For example, when the user sits on a sofa, the keyboard device 4 is placed on the thighs of the user and the mouse device 5 is placed on the supporting plate 451. In other words, the gesture of operating the computer host meets the ergonomics requirements. Consequently, the drawbacks of the conventional technologies can be solved. In the keyboard device 4 of the present invention, the sliding member 45 is stored in the space between the keyboard base 41 and the top cover 42. Since the sliding member 45 is not exposed outside, the keyboard device 4 is aesthetically pleasing.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A keyboard device, comprising: a keyboard base comprising a base slot; a top cover for covering the keyboard base; plural keys penetrated through the top cover and partially exposed outside the top cover; a storing frame fixed on a bottom surface of the top cover, wherein a first end of the storing frame is arranged near the base slot; and a sliding member selectively stored within the storing frame or moved relative to the keyboard base to be partially protruded out of the base slot, wherein when the keyboard device is in a storage state, the sliding member is stored within the storing frame, wherein when the keyboard device is in a mouse operation state, the sliding member is partially protruded out of the storing frame and the base slot so as to support a mouse device, wherein the storing frame comprises: a main body fixed on the bottom surface of the top cover; a track structure arranged around a portion of the main body, wherein the sliding member is accommodated within the track structure, and the sliding member is movable relative to the keyboard base along the track structure; a first notch formed in the track structure and located at a first side of the track structure, wherein when the sliding member is inserted into the first notch, the sliding member is fixed on the storing frame; and a second notch formed in the track structure and located at a second side of the track structure, wherein when the sliding member is inserted into the second notch, the sliding member is fixed on the storing frame, and wherein the sliding member comprises: a supporting plate, wherein the mouse device is supported on a top surface of the supporting plate; a linking plate disposed on a bottom surface of the supporting plate and movable relative to the supporting plate; a locking element connected with the linking plate and permitted to be swung relative to the linking plate, wherein when the locking element is inserted into the first notch or the second notch, the sliding member is fixed on the storing frame; a poke rod located at an end of the linking plate and partially exposed outside the keyboard base, wherein while the poke rod is poked, the linking plate is correspondingly moved; and an elastic element arranged between a sidewall of the supporting plate and the poke rod, wherein while the elastic element is pushed by the poke rod, the elastic element is compressed to generate an elastic force.

2. The keyboard device according to claim 1, wherein the track structure is integrally formed with the main body.

3. The keyboard device according to claim 1, wherein the sliding member further comprises a covering part, and the covering part comprises an aperture, wherein the linking plate is covered by the covering part, the covering part is disposed on the bottom surface of the supporting plate, and the poke rod is exposed outside the covering part through the aperture.

4. The keyboard device according to claim 1, wherein when the keyboard device is in the storage state, a first end of the supporting plate is contacted with a second end of the storing frame, the linking plate is in a first position of the supporting plate, the locking element is inserted into the first notch, the sliding member is fixed on the storing frame, and the poke rod is located under the base slot, wherein when the keyboard device is in the mouse operation state, the first end of the supporting plate is arranged near the first end of the storing frame, the linking plate is in the first position of the supporting plate, the locking element is inserted into the second notch, the sliding member is fixed on the storing frame, and the poke rod is located at a position away from the base slot.

5. The keyboard device according to claim 1, wherein while the poke rod is poked and moved to push the elastic element, the elastic element is compressed, the linking plate is moved from a first position of the supporting plate to a second position of the supporting plate, and the locking element is moved with the linking plate and detached from the first notch, wherein while the sliding member is moved and the supporting plate is moved relative to the keyboard base along the track structure, the supporting plate is moved to a position near the base slot, the linking plate and the locking element are moved with the linking plate, and the locking element is arranged near the second notch.

6. The keyboard device according to claim 1, wherein the linking plate comprises plural fixing holes, and plural first fixing elements are penetrated through the corresponding fixing holes, so that the linking plate is disposed on the bottom surface of the supporting plate, wherein the linking plate is movable relative to the supporting plate through the plural first fixing elements and the plural fixing holes.

7. The keyboard device according to claim 1, wherein the locking element comprises a locking hole, and a second fixing element is penetrated through the locking hole, so that the locking element is fixed on a bottom surface of the linking plate, wherein the locking element is permitted to be swung relative to the linking plate through the second fixing element and the locking hole.

8. The keyboard device according to claim 1, wherein the keyboard device further comprises a circuit board, which is fixed on a bottom side of the top cover and comprises plural circuit board holes, wherein the circuit board comprises plural hooks, which are disposed on the bottom surface of the top cover and aligned with the corresponding circuit board holes, wherein after the plural hooks are penetrated through the corresponding circuit board holes and engaged with the corresponding circuit board holes, the circuit board is fixed on the bottom side of the top cover.

* * * * *